June 6, 1967 W. L. THIBODEAU 3,324,224

HIGH FREQUENCY INTERCONNECTIONS

Filed Sept. 1, 1965 2 Sheets-Sheet 1

INVENTOR
WILLIAM L. THIBODEAU
BY
AGENT

June 6, 1967 W. L. THIBODEAU 3,324,224

HIGH FREQUENCY INTERCONNECTIONS

Filed Sept. 1, 1965 2 Sheets-Sheet 2

INVENTOR
WILLIAM L. THIBODEAU
BY [signature]
AGENT

United States Patent Office 3,324,224

Patented June 6, 1967

3,324,224

HIGH FREQUENCY INTERCONNECTIONS

William L. Thibodeau, Wellesley, Mass., assignor to Raytheon Company, Lexington, Mass., a corporation of Delaware Filed Sept. 1, 1965, Ser. No. 484,265

7 Claims. (Cl. 174—35)

This invention relates to high frequency interconnections and, more particularly, to a device for interconnecting modules and employing a structure which accomplishes efficient shielding through frequency ranges up to 1000 mc.

The prior art is replete with devices and methods for isolating one high signal level stage from a susceptible stage adjacent to it, the most familiar being shielded cables, coaxial connectors, grounding springs and complicated or intricate boxes or bracketry for accomplishing such isolation. However, none of these devices and methods are entirely successful for the interconnection of modules of integrated receivers such as are used in advanced weapons systems or the like where extremely efficient shielding is required in the interconnections between modules arranged in compact form in small modular devices.

The present invention overcomes the disadvantages of prior art devices and methods and provides means whereby relatively complicated circuit runs may be efficiently shielded from one another while efficiently interconnecting modules arranged in a particular preselected fashion. This is achieved by the provision of a metal plate having grooves or channels therein corresponding to the individual runs of a printed circuit pattern. Within the grooves are located the circuit runs which are completely surrounded by a dielectric encapsulation compound which fills the grooves to the height of the surface of the metal plate. The plate surface is plated or otherwise completely covered with metal except in the areas where interconnections are made, whereby metal thus surrounds each conductor path, signal or voltage. The metal covering may advantageously be a separate metal cover or plate having holes corresponding to the interconnection areas where module wires are joined to the printed circuit runs, and the modules themselves are suitably mounted on the top plate.

In such a device, the masses of metal in both the cover and the plate provide a heat sink capability as an inherent characteristic of the structure and, if desired, suitable fins or other cooling radiators may be attached as required to yield any degree of heat transfer.

The cavilities at which interconnections are made are filled with a selected material or compound such as silica gel which seals the entire assembly and renders it impervious to moisture.

Further, in such a device as described herein, capacitance or field between the ground plane and the signal carrier and inductance are readily determined and controlled by preselection of the special relationship of the dielectric medium and its depth and width placement in the base plate. Ground loops are virtually eliminated due to the large cross-sectional area of the package and careful consideration of module placement. Individual circuits obtain ground from the same common broad plate, therefore assuring the same ground for the entire system. Furthermore, the attachment of shielded modules to the interconnection plates establishes a mechanical ground for each assembly and assures the same ground potential for all components.

In a second embodiment of the invention a twin conductor coaxial line may be incorporated into a channel, thereby allowing flexible grounding techniques. One conductor would then serve as a single point ground and its mate serve as the signal carrier. This embodiment has its maximum utilization in high impedance low level circuitry.

The present invention has many other possible applications. For example, a fixed delay line may be built into the cover of a piece of equipment, be tuned to the given equipment and add no volume to the overall package. Another application for a device of this character is its use in a receiver as a local oscillator strip transmission line device at microwave frequencies.

Other objects and advantages of this invention will become apparent from the following description taken in connection with the accompanying drawings, wherein.

Referring more particularly to the drawings wherein like characters of reference designate like parts throughout the several views, the preferred embodiment of the invention is fabricated by first establishing the pattern of runs on paper. This layout on paper is analogous to the layout of a single-sided printed circuit board, the criterion being that no two points cross one another, although they may join or intersect.

Line widths for a printed circuit run are established at this time, as well as interconnection land areas. The spacing desired between adjacent runs is also established, and module arrangement is planned to comply with the interconnection pattern.

Figures 1, 2, 3, 4:
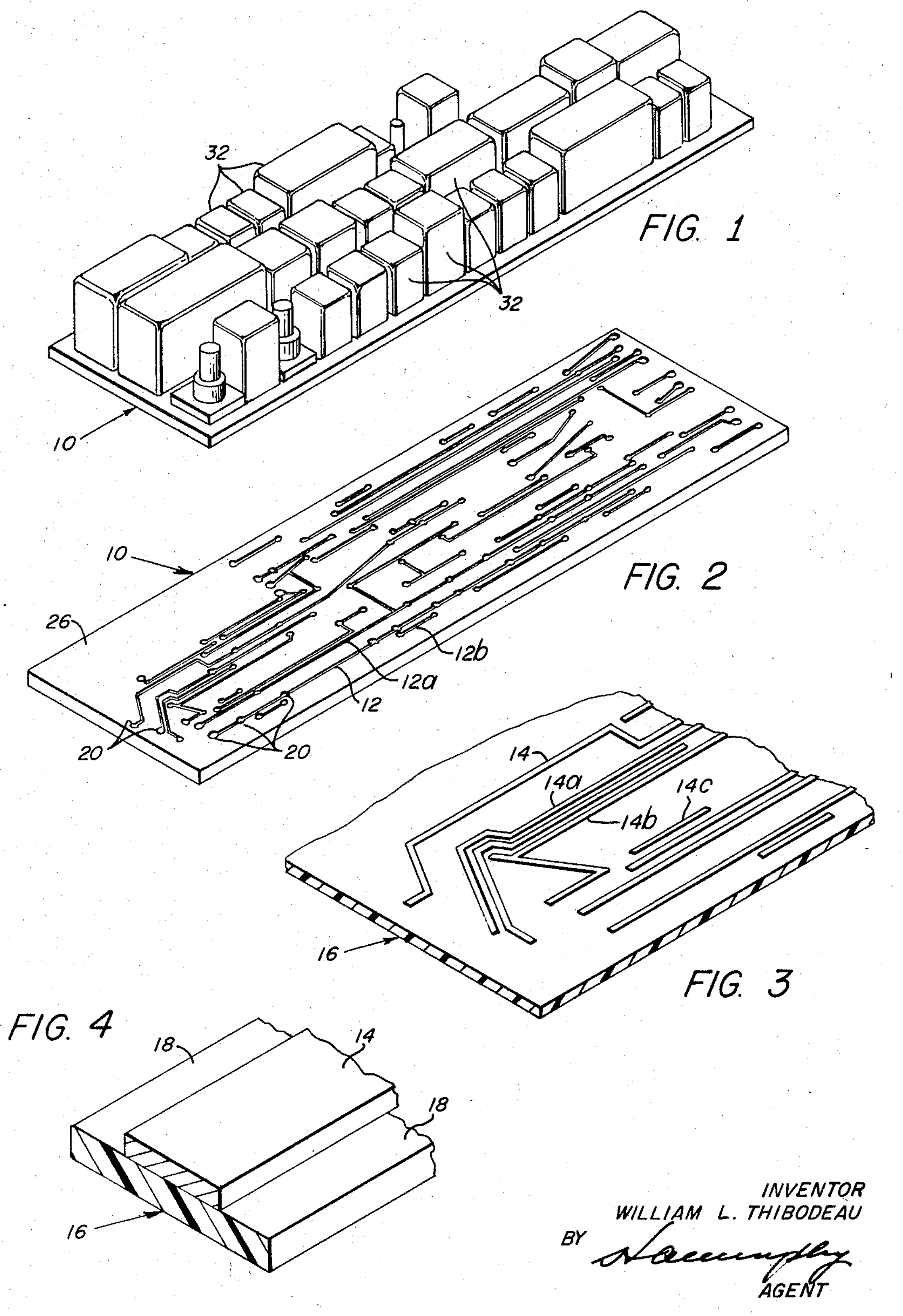
FIG. 1 is a perspective view of a module employing the invention.
FIG. 2 is a perspective view of the metal base plate forming part of the invention.
FIG. 3 is an enlarged fragmentary view of the printed circuit.
FIG. 4 is an enlarged fragmentary view of a printed circuit run.

In accordance with this invention, a metal plate 10 (FIG. 2), of aluminum or other selected metal, is provided with a plurality of grooves or channels 12, 12*a*, 12*b*, etc., which may be etched, machined or die cast in the metal to correspond to the configuration or pattern of the circuit. The printed circuit, which is made from the previously prepared pattern, comprises runs 14, 14*a*, 14*b*, etc. (FIG. 3) of metal which are printed onto an epoxy or other dielectric support 16 by conventional and well-known methods. The individual runs are die cut into separate pieces from the master pattern and marginal portions 18 of the epoxy material are allowed to remain as shown in FIG. 4.

Before assembling the circuit with the metal base plate 10, the lower regions of the grooves or channels in the plate are preferably covered with epoxy resin 22 (FIG. 5) to any selected depth. The epoxy resin is poured into the channels and allowed to solidify. Individual pieces or runs are then placed in the respective channels or grooves 12 upon the hardened resin, the marginal portions 18 of the resin maintaining the metal conductors 14 out of engagement with the side walls of the grooves. The land areas wherein interconnections are to be made are then plugged. The land areas are generally indicated in the drawings as rounded end or intermediate portions 20 (FIG. 2), and the plugs conveniently may be of wood, ceramic or Teflon material to which the epoxy resin will not adhere.

The unplugged exposed portions of the grooves are then filled with a dielectric encapsulation compound 24, such as Stylcast 1090, to the level of the adjacent surface of the metal plate 10. After the compound has been allowed to harden, the plugs are removed. The plate now presents a substantially flush surface with all metal conductors completely sealed within the body of the plate but insulated therefrom by the dielectric compound as shown in FIG. 5, except in the contact or interconnection areas.

At this point in the fabrication of the device, all the contact areas are suitably masked by covering these areas with tape and the entire unmasked surface 26 is then made conductive by conventional electroplating techniques. By this means, each conductor is completely surrounded by metal and thus shielded from other conductors.

An alternative method of shielding the conductors in a grooved metal base plate 10 is to provide a separate top plate 28 (FIG. 6) which overlies plate 10. Top plate 28 is provided with apertures aligned with the interconnection areas in plate 10 so that wires or leads extending from modules to be mounted on the plate 28 may be projected therethrough into the land areas and into position for soldered or welded connection to the metal conductors 14. Such holes or apertures may be easily formed in an aluminum plate, for example, by a stamping or punching operation. The top plate 28 is joined to base plate 10 by brazing or soldering to yield functional hardware at minimum expense.

Figures 5, 6:
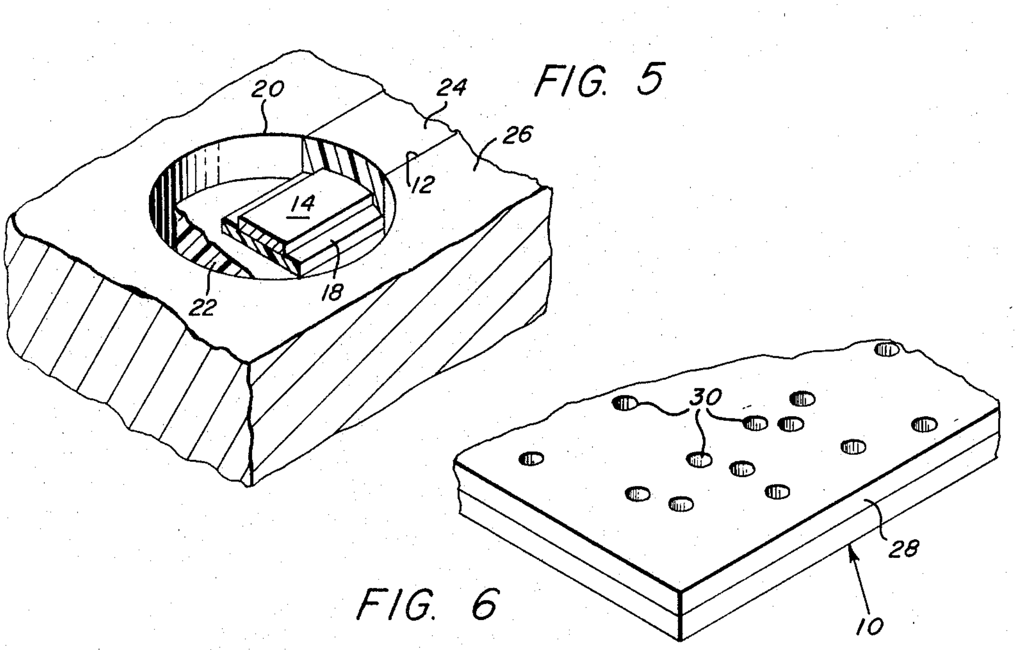
FIG. 5 is an enlarged perspective view of an end of a printed circuit run reposing in a land area where an interconnection is to be made.
FIG. 6 is an enlarged perspective view of an embodiment of the invention wherein a metal top plate is employed.

After the masking has been removed from the embodiment shown in FIG. 5, or after top plate 28 has been secured in place in the embodiment of FIG. 6, the modules 32 (FIG. 1) are added to the system by soldering or welding the pigtail leads (not shown) extending therefrom to the conductors 14.

The modules 32 preferably include metal shields or covers which may be screwed or otherwise fixed to the supporting plate to retain the parts rigidly in assembled relation. Suitable connections (not shown) may be added to connect the device into external circuitry.

The assembled system is made impervious to moisture after all sub-assemblies are mounted in place. The interconnection areas 20 up to this point are exposed. However, areas 20 are conveniently filled with a silica gel to seal the entire assembly.

Figure 7:
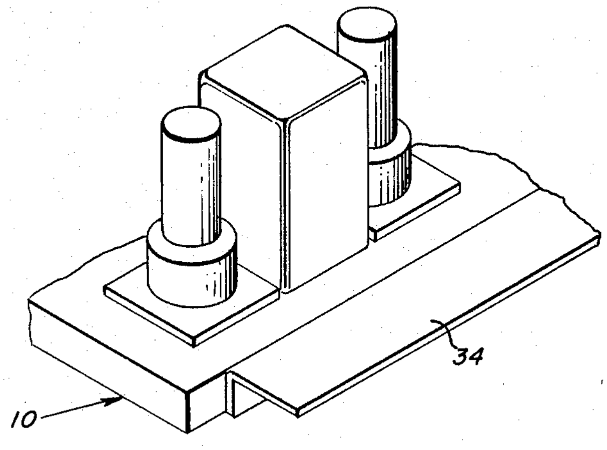
FIG. 7 is a fragmentary view of the device of FIG. 1 showing cooling fins.

The masses of metal utilized in the device provide a heat sink capability as an inherent characteristic. To provide additional cooling, outwardly extending metal fins 34 (FIG. 7) may be conveniently added to the plate 10 to increase heat dissipation.

Figure 8:
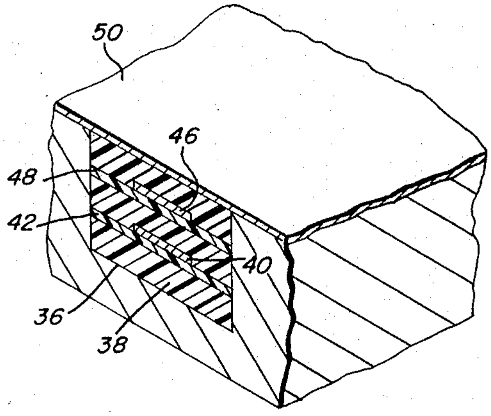
FIG. 8 is an enlarged fragmentary sectional view of a modification of the invention wherein two circuit runs are employed.

In FIG. 8 there is shown an embodiment of the invention wherein a twin conductor coaxial line is incorporated into a channel 36, thereby allowing flexible grounding techniques to be employed. In channel 36 there is located a first or bottom layer 38 of resin upon which one conductor 40, together with its supporting epoxy sheet 42, is positioned. Over conductor 40 is placed a second or intermediate layer 44 of resin upon which is the second conductor 46 and the epoxy support 48. Metal coating or plate 50 covers the channel and thus effectively shields both conductors 40–46 from other conductors in the assembly.

While the foregoing description refers to the dielectric material used in the device as being Stycast 1090, it is to be understood that the dielectric material must be selected to have certain qualities, and the grooved metal plate also should have certain characteristics, dependent upon the frequency of the device. For example, in a device having a center frequency of 30 mc., the width of the conductor 14 should be about 0.043" and its thickness should be about 0.002". The groove 12 should be about 0.122" deep, and the $E_n$ or property of dielectric should be about 2.55.

From the foregoing it will be apparent that all of the objectives of this invention have been achieved by the device described hereinbefore. It is to be understood, however, that various changes and modifications may be made by those skilled in the art without departing from the spirit of the invention as expressed in the accompanying claims. Accordingly, all matter shown and described should be interpreted as illustrative and not in a limiting sense.

I claim:

1. A device for high frequency interconnection of electrical components, comprising a metal plate having grooves in one surface thereof arranged in a predetermined circuit configuration, each groove having at least one portion of enlarged width providing an interconnection region, circuit runs within said grooves and having land areas lying within said interconnection regions, a metal covering disposed substantially continuously over the grooved surface of the plate and over the circuit runs and having apertures therein corresponding with said interconnection regions, insulating material enclosing said circuit runs and electrically insulating the runs from the walls of the grooves and from the metal covering, and electrical components on said metal covering electrically connected to selected land areas of the circuit runs through the apertures in the metal covering.

2. An interconnection device substantially as set forth in claim 1, wherein said circuit runs each comprise a layer of insulating material of a width slightly less than the width of the respective groove in which it lies, and a strip of conducting material fixed on said layer of insulating material, the insulating material being substantially wider than the conducting strip for spacing the edges of the strip from the side walls of the groove.

3. An interconnection device substantially as set forth in claim 1, wherein said metal plate is provided with outwardly extending cooling fins.

4. An interconnection device substantially as set forth in claim 1, wherein said metal covering is an electroplated metallic deposit.

5. An interconnection device substantially as set forth in claim 1, wherein said metal covering is a second metal plate bonded to the first metal plate.

6. An interconnection device substantially as set forth in claim 1, wherein a second circuit run is disposed within each groove in spaced relation with the respective first run therein and electrically insulated therefrom and from the walls of the groove.

7. An interconnection device substantially as set forth in claim 1, wherein interconnection regions in the metal plate and the apertures in the metal covering are filled with silica gel for rendering the device impervious to moisture.

No references cited.

LEWIS H. MYERS, *Primary Examiner.*

D. L. CLAY, *Assistant Examiner.*